(12) United States Patent  
Miyazaki

(10) Patent No.: US 7,308,298 B2  
(45) Date of Patent: Dec. 11, 2007

(54) MAGNETIC RESONANCE IMAGING USING MT PULSE OF WHICH DURATION IS SHORTER

(75) Inventor: Mitsue Miyazaki, Otawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 459 days.

(21) Appl. No.: 10/024,536

(22) Filed: Dec. 21, 2001

(65) Prior Publication Data

US 2002/0169372 A1 Nov. 14, 2002

(30) Foreign Application Priority Data

Dec. 22, 2000 (JP) ............... 2000-391026

(51) Int. Cl.  
*A61B 5/05* (2006.01)

(52) U.S. Cl. ............... 600/410; 324/306; 324/307; 324/309

(58) Field of Classification Search ............... 324/300, 324/306–309, 316, 318, 321; 600/410, 407; 128/653.2–653.5  
See application file for complete search history.

(56) References Cited

U.S. PATENT DOCUMENTS

| | | | | |
|---|---|---|---|---|
| 4,795,978 A | * | 1/1989 | Zur et al. ............... | 324/309 |
| 5,250,898 A | * | 10/1993 | Hu et al. ............... | 324/309 |
| 5,339,035 A | * | 8/1994 | Schneider et al. ............... | 324/309 |
| 5,423,317 A | * | 6/1995 | Iijima et al. ............... | 600/410 |
| 5,627,468 A | | 5/1997 | Kojima et al. | |
| 5,704,357 A | | 1/1998 | Miyazaki et al. | |
| 2002/0188190 A1 | | 12/2002 | Kassai | |
| 2004/0059213 A1 | | 3/2004 | Kassai | |

FOREIGN PATENT DOCUMENTS

JP 11-313810 11/1999

OTHER PUBLICATIONS

Hirayama et al, Japanese Journal of Magnetic Resonance in Medicine 20, 201 (2000) and English abstract, III-2-5 and III-2-06.  
Melki et al, "Magnetization Transfer Effects in Multislice Rare Sequences", Magentic Resonance in Medicine 24, 189-195 (1992).

(Continued)

*Primary Examiner*—Brian L. Casler  
*Assistant Examiner*—Baisakhi Roy  
(74) *Attorney, Agent, or Firm*—Nixon & Vanderhye P.C.

(57) ABSTRACT

A magnetic resonance imaging technique provides adequate MT effects by applying a shortened MT pulse and scan time. An MT pulse whose frequency is off-resonance to a region to be imaged of an object is first applied to he object, a spoiler pulse is applied to the object, and an echo signal is acquired from the region to be imaged. The duration of the MT pulse is set to a relatively shorter time than conventional. Preferably, the duration is less than 10 ms. The area of the MT pulse waveform is set to a specified value equivalent to the conventional. The MT pulse is preferably applicable to a two-dimensional scan using the multislice technique but can also be used in a three-dimensional scan.

13 Claims, 6 Drawing Sheets

OTHER PUBLICATIONS

Finelli et al, "Improved Contrast of Enhancing Brain Lesions on Postgadolinium, T1 Weighted Spin-Echo Images with Use of Magnetization Transfer", RADIOLOGY, Feb. 1994, pp. 553-559.

Elster et al, "Cranial Tissues: Appearance to Gadolinium-Enhanced and Nonenhanced MR Imaging with Magnetization Transfer Contrast", NEURORADIOLOGY, pp. 541-546, Feb. 1994.

Mathews et al, "Cerebral Infarction: Effects of Dose and Magnetization Transfer Saturation at Gadolinium-Enhanced MR Imaging", RADIOLOGY, Feb. 1994, pp. 547-552.

"Magnetization Transfer Time-of-Flight Magnetic Resonance Angiography", Magnetic Resonance in Medicine 25, 372-379 (1992).

"A Novel Saturation Transfer Contrast Method for 3D Time-of-Flight Magnetic Resonance Angiography: A Slice-Selective Off-Resonance Sinc Pulses (SORS) Technique,", Magnetic Resonance in Medicine 32, 52-59 (1994).

"Magnetization Transfer Effects in Multislice Rare Sequences," Magnetic Resonance in Medicine 24, 189-195 (1992).

* cited by examiner

[CONVENTIONAL EXAMPLE]

| SEQUENCE NAME | PULSE LENGTH(ms) | τ-LENGTH (μs) | PVA SIGNAL VALUE | NOISE | S/N | TR |
|---|---|---|---|---|---|---|
| SE15-MTC750 | 1.5 | 750 | 470.2 | 11.2 | 41.98214 | 576 |
| SE15-MTC1000 | 2 | 1000 | 528.8 | 10.7 | 49.42056 | 661 |
| SE15-MTC1500 | 3 | 1500 | 607.1 | 11.0 | 55.19091 | 797 |
| SE15-MTC3000 | 6 | 3000 | 734.9 | 11.0 | 66.80909 | 1086 |
| SE15-MTC5000 | 10 | 5000 | 803.1 | 10.6 | 75.76415 | 1222 |

| SEQUENCE NAME | PULSE LENGTH(ms) | τ-LENGTH (μs) | PVA SIGNAL VALUE | NOISE | S/N | SLICE NUMBER |
|---|---|---|---|---|---|---|
| SE15-MTC750 | 1.5 | 750 | 452.9 | 11.1 | 40.80180 | 14 |
| SE15-MTC1000 | 2 | 1000 | 489.4 | 11.0 | 44.49091 | 12 |
| SE15-MTC1500 | 3 | 1500 | 501.8 | 10.4 | 48.25000 | 10 |
| SE15-MTC3000 | 6 | 3000 | 562.5 | 10.5 | 53.57143 | 7 |
| SE15-MTC5000 | 10 | 5000 | 566.5 | 10.5 | 53.95238 | 6 | ical example has been proposed by U.S. Pat. No. 5,050,609
MAGNETIC RESONANCE IMAGING USING MT PULSE OF WHICH DURATION IS SHORTER

BACKGROUND OF THE INVENTION

1. Technical Field of the Invention

The present invention relates to magnetic resonance imaging for obtaining images of blood flow or parenchyma of an object on the basis of a magnetic resonance phenomenon of nuclear spins in the object, and in particular, to a magnetic resonance imaging system and a magnetic resonance imaging method which provide an image whose contrast between blood (or blood flow) and parenchyma is improved by using an MT (magnetization transfer) pulse.

2. Related Art

Magnetic resonance imaging (MRI) is, in general, a technique of applying to an object a radio-frequency (RF) signal at a Larmor frequency so that nuclear spins of the object positioned in a static magnetic field are magnetically excited, and reconstructing an image from MR signals induced responsively to the excitation.

There is a technique of MR angiography for imaging blood vessels as one of the fields of the magnetic resonance imaging. One conventional technique for the MR angiography, which has been put to frequent use in recent years, is to obtain a blood flow image in which blood (blood flow) and parenchyma are contrasted with MT effects (also referred to as MTC (magnetization transfer contrast) effects). One practical example has been proposed by U.S. Pat. No. 5,050,609 (its title is "Magnetization Transfer Contrast and Proton Relaxation and Use thereof in Magnetic Resonance Imaging").

The research of the MT effects originates from the study of a ST (saturation transfer) method by Forsen & Hoffman (refer to "Forsen et al., Journal of Chemical Physics, Vol. 39(11), pp. 2892–2901 (1963)"). The MT effects are based on chemical exchange and/or cross relaxation between protons of a plurality of types of nuclear pools, such as free water and macromolecules.

As the conventional MR angiography that uses the MT effects, several techniques have been proposed as below.

As is well known, the spectra of protons of free water and macromolecules include the same common frequency range, in which both of the free water of which T2 (spin-spin) relaxation time is longer (T2 is approx. 100 msec) and the macromolecules of which T2 relaxation time is shorter (T2 is approx. 0.1 to 0.2 msec) resonate. Since the T2 relaxation time of a free water signal is longer, its Fourier-transformed signal provides a peak curve of which half-width value is narrow. However, in the case of a signal of protons whose movement is restricted among macromolecules, such as protein, its Fourier-transformed signal provides a broader half-width value, due to a shorter T2 relaxation time. As a result, no distinct peak will appear in the spectrum.

Off-resonance excitation is performed such that, when taking the resonance peak frequency $f_0$ of free water as a center frequency, a frequency-selective pulse serving as the MT pulse is applied to an object to excite a frequency spectrum range shifted by, for example, an amount of 500 Hz from the center frequency $f_0$. This excitation causes the magnetization Hf of the free water and those Hr of macromolecules, both of which have been in equilibrium, to the magnetization Hf of the free water moves to those Hr of the macromolecules. As a result, the value of an MR signal induced from the protons of the free water decreases, while that of an MR signal induced from the protons of the macromolecules also decrease, but at a higher rate. This will cause differences in signal values, region by region, depending on the chemical exchange and/or cross relaxation between the free water and the macromolecules are reflected or not. Those differences lead to differences in contrast between blood flow and parenchyma, thus providing a blood flow image.

At present, the MR angiography based on the MT effects is generally classified into two types of spatially non-selective imaging and slice-selective imaging.

As an example of the former, known is "G. P. Pike, MRM 25, 327–379, 1992", in which a frequency-selective binomial pulse is used as the MT pulse and applied in a spatially non-selective manner. The contrast between parenchyma and blood flow is obtained according to a relationship of "the MT effects of parenchyma>the MT effects of blood flow."

On the other hand, as an example of the latter, there is an imaging technique proposed by "M. Miyazaki, MRM 32, 52–59, 1994." This paper teaches the use of a slice-selective MT pulse composed of both an RF excitation pulse of which duration, that is, a wavelength of the pulse, is longer and gradient spoiler pulses. The application of the MT pulse reduces MR signals emanated from stationary parenchyma of an imaged slice, largely than that from flows of blood that pass the slice, due to its MT effects. The application also reduces the MT effects received by blood flow that comes into the slice, but its reduced degree of a signal from the blood flow is less than that from the parenchyma, so that a certain level of contrast between blood flow and parenchyma is created.

There has also been known a technique of time-of-flight (TOF) angiography conducted in the form of three-dimensional scanning of the head. In this angiography, the duration of an MT pulse is normally specified as being approximately 15 [msec].

Further, concerning MT effects in the multislice imaging, there has been known various reports on "P S Melki and R V Mulkern, Magnetization Transfer Effects in Multislice RARE Sequence", Magn Reson Med 24, 189–195(1992)", "A D Elster, Radiology 1994; 190:541–551", and "D A Finem, Radiology 1994; 190:553–559." These reports show the use of an MT pulse having an wavelength of 10 to 16 msec.

However, in any of the foregoing various types of MR imaging that adopts the MT pulse, the wavelength of the MT pulse, that is, the duration during which the pulse lasts, is set to a longer value. The duration of the MT pulse occupies, for example, a time of no less than about 35 percent within a single repetition time TR. This longer-duration MT pulse has long been used on the basis of the historical recognition that a shorter-duration MT pulse, that is, its waveform area is insufficient, will limit the MT effects to its lower level.

Thus, to obtain sufficient MT effects one is obliged to make an entire scan time (resulting in an imaging time) longer. In contrast, if performing the multislice imaging is conducted with an MT pulse having a longer duration, with the scan time still unchanged, the number of slices will be reduced.

SUMMARY OF THE INVENTION

The present invention, which has been attempted to break through the foregoing current situations, achieves a first object that MT effects equivalent in degree to the conventional is at least obtained and a scan time necessary for the application of an MT pulse is made shorter than the conventional technique.

A second object of the present invention is to provide two-dimensionally scanned MR imaging on the multislice imaging that uses an MT pulse, which gains at least MT effects equivalent in degree to the conventional in comparison with the conventional technique, makes it shorter a scan time necessary for the application of an MT pulse, and maintains the number of multiple slices almost equal to an amount obtained by the conventional technique.

A third object of the present invention is to provide three-dimensionally scanned MR imaging that uses an MT pulse, which gains at least MT effects equivalent in degree to the conventional and makes it shorter a scan time necessary for the application of an MT pulse in comparison with the conventional technique.

In order to accomplish the first object, a magnetic resonance imaging system according to the present invention comprises MT-pulse applying means for applying to an object an MT pulse of which is off-resonance to a region to be imaged of the object; spoiler applying means for applying a gradient spoiler pulse to the object after the MT pulse is applied; and scanning means for performing a scan to acquire an echo signal from the region to be imaged after the gradient spoiler pulse is applied, wherein a duration of the MT pulse is set to a short time.

By way of example, the duration of the MT pulse is less than 10 ms. Particularly, the duration of the MT pulse is 6 ms or less.

Preferably, the MT pulse is, in a waveform area, approximately equal to or less than a conventional MT pulse of which duration is longer.

In addition, in order to accomplish the second object, the scanning means can be configured to two-dimensionally scan the region to be imaged on the basis of multi-slice imaging.

Furthermore, in order to attain the third object, the scanning means may be configured to three-dimensionally scan the region to be imaged on the basis of multi-slice imaging. In this configuration, it is preferred that the magnetic resonance imaging system may additionally comprise region selecting means configured to apply, concurrently with the application of the MT pulse, a gradient pulse to select an applied position of the MT pulse to the object so that the applied position of the MT pulse is different from the region to be imaged Still, in the magnetic resonance imaging system of the present invention, a duration of the MT pulse may be set to a short time during which relaxation of a spin-lattice magnetization of a magnetic spin of the object is hardly completed.

On the other hand, in order to accomplish the first object, a magnetic resonance imaging method for acquiring an echo signal on the basis of magnetic resonance phenomena of at least two types of nuclear pools in an object, the two types of nuclear pools being mutually coupled though a coupling relationship based on at least one of a chemical exchange phenomenon and a cross relaxation phenomenon, the method comprising the steps of: decoupling the coupling relationship between the at least two types of nuclear pools by applying to the object an MT pulse of which duration is short; applying a gradient spoiler pulse to the decoupled nuclear pools; and acquiring the echo signal from a region to be imaged of the object.

By way of example, the two types of nuclear pools consist of a nuclear pool of free water and a nuclear pool of a macromolecule. In addition, to realize the second or third object, the echo signal from the region to be imaged may be acquired by a two-dimensional scan based on multi-slice imaging that uses an MT pulse or by a three-dimensional scan based on multi-slice imaging that uses an MT pulse. One example is that the duration of the MT pulse is less than 10 ms.

DETAILED DESCRIPTION OF THE PREFERRED EMBODIMENTS

Referring to the accompanying drawings, preferred embodiments of the present invention will now be described.

(First Embodiment)

Referring to FIGS. 1 to 9, a first embodiment of the present invention will now be described.

Figure 1:
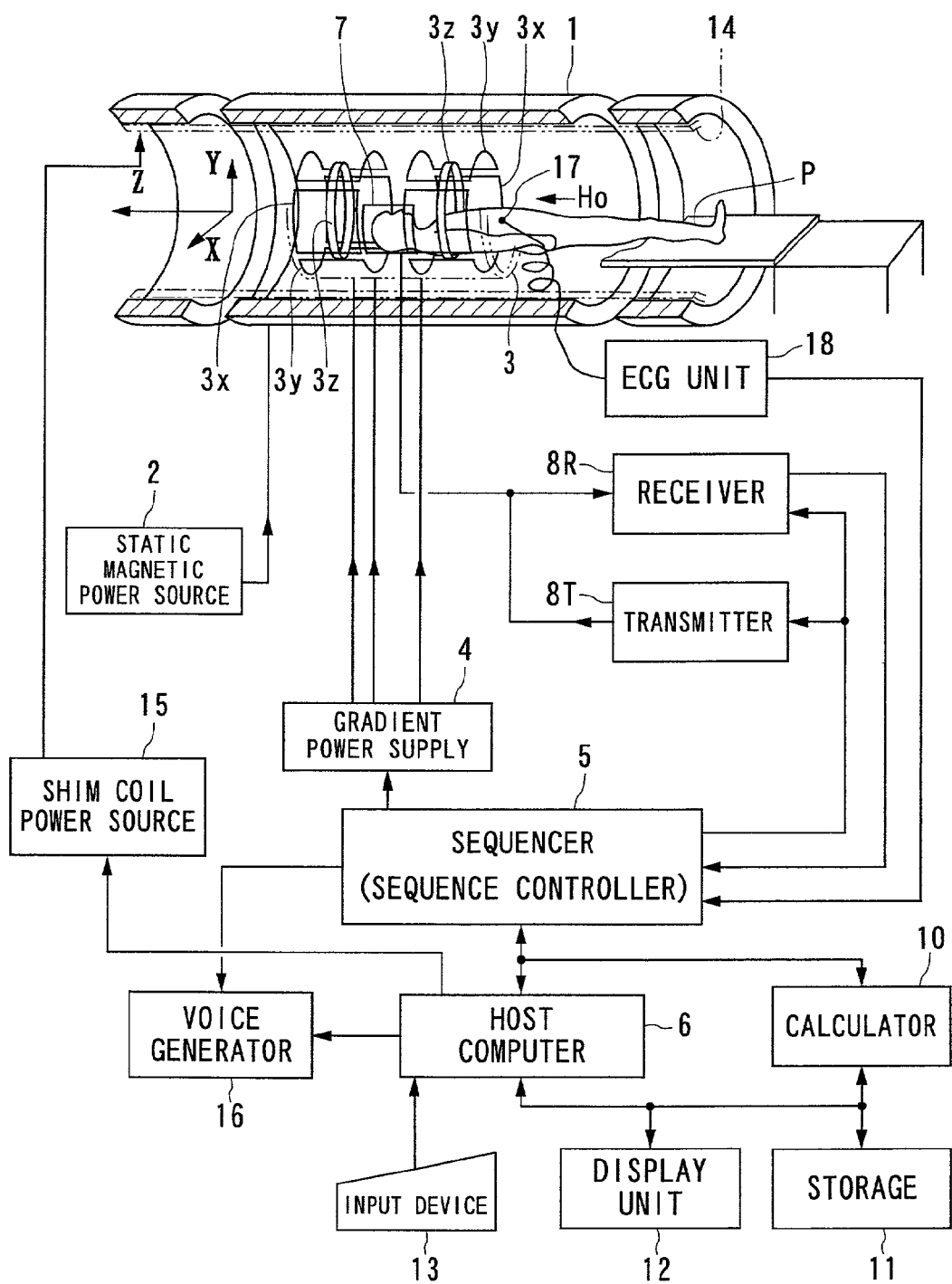
FIG. 1 is the functional block diagram showing an outlined configuration of a magnetic resonance imaging system according to the first and second embodiments of the present invention.

FIG. 1 a shows an outlined configuration of a magnetic resonance imaging (MRI) system in accordance with the first embodiment of the present invention.

The magnetic resonance imaging system comprises a patient couch on which a patient P as an object to be imaged lies down, static-field generating unit for generating a static magnetic field, magnetic-gradient generating unit for appending positional information to a static magnetic field, transmitting/receiving unit for transmitting and receiving a radio-frequency (RF) signal, controlling/calculating unit responsible for the control of the whole system and for image reconstruction, electrocardiographing unit for acquiring an ECG signal of the object P, and breath-hold instructing units for instructing the object to perform a temporary breath hold.

The static-field generating unit includes a magnet 1 that is of, for example, a superconducting type, and a static power supply 2 for supplying a current to the magnet 1, and generates a static magnetic field Ho in an axial direction (Z-axis direction) within a cylindrical bore (serving as a diagnostic space) into which the object P is inserted. The magnet 1 includes shim coils 14. A current used to homogenize a static magnetic field is supplied from a shim coil power supply 15 to the shim coils 14 under the control of a host computer to be described later. The couch top of the patient couch on which the object P lies down can be inserted into the bore of the magnet 1 so that the couch top is withdrawn retractably.

The magnetic-gradient generating unit includes a gradient coil unit 3 incorporated in the magnet 1. The gradient coil unit 3 has three pairs (kinds) of x-, y-, and z-coils 3x to 3z used to generate magnetic field gradients that change in strength in the X-axis, Y-axis, and Z-axis directions, which are the mutually-orthogonal physical-axis directions of the gantry. The magnetic-gradient generating unit further includes a gradient power supply 4 for supplying currents to the x-, y-, and z-coils 3x to 3z. The gradient power supply 4 supplies the x-, y-, and z-coils 3x to 3z with pulsed currents used to generate magnetic gradients, under the control of a sequencer that will be described later.

The pulsed currents supplied from the gradient power supply 4 to the x-, y-, and z-coils 3x to 3z are controlled, whereby magnetic gradients that can be changed in strength in the three physical-axis directions (that is, the X-, Y-, and Z-directions) are mutually synthesized. This synthesis produces a slice magnetic gradient $G_S$ applied in a slice direction, a phase-encode magnetic gradient $G_E$ applied in a phase-encode direction, and a readout (frequency-encode) magnetic gradient $G_R$ applied in a readout direction, so that the gradients $G_S$, $G_E$ and $G_R$ are selectively specified and arbitrarily changed in strength. The slice, phase-encode, and readout directions are logic-axis directions, which are also orthogonal to each other. The magnetic gradients $G_S$, $G_E$ and $G_R$ generated in the logic-axis directions are superposed on the static magnetic field $H_0$.

The transmitting/receiving unit includes a radio-frequency (RF) coil 7 located in the vicinity of the object P in the diagnostic space inside the magnet 1, and a transmitter 8T and a receiver 8R both connected to the coil 7. Both of the transmitter 8T and the receiver 8R operate under the control of a sequencer 5 described later. The transmitter 8T supplies the RF coil 7 with an RF current pulse of a Larmor frequency, which causes a nuclear magnetic resonance (NMR). The receiver SR receives MR signals (RF signals) via the the RF coil 7, and then carries out various kinds of signal processing with the MR signals so that digitized MR data (original data) are produced.

Furthermore, the controlling/calculating unit includes a sequencer 5 (also referred to as a sequence controller), host computer 6, calculator 10, storage 11, display unit 12, input device 13, and voice generator 16.

Of these constituents, the host computer 6 operates previously memorized software procedures, so that it has the functions of not only giving the sequencer 5 pulse sequence information but also managing the operations of the entire system.

The sequencer 5, which has a CPU and memories, is able to store pulse sequence information that has been supplied from the host computer 6. Based on this pulse sequence information, the sequencer 5 is responsible for controlling a series of operations performed by the gradient power supply 4, transmitter 8T, and receiver 8R. In parallel with this control, the sequencer 5 temporarily receives digital data produced from MR signals that the receiver 8R has created, and then transfer those data to the calculator 10.

The pulse sequence information includes all information required for operating the gradient power supply 4, transmitter 8T, and receiver 8R according to a desired pulse sequence. Such information includes the strength, duration, and application timing of pulsed currents that should be applied to the x-, y-, and z-coil 3x to 3z.

As the pulse sequence, a two-dimensional (2D) scan or a three-dimensional (3D) scan can be adopted. Pulse trains available to the pulse sequence are a pulse train based on an SE (spin echo) technique, a pulse train based on an FE (field gradient echo) technique, a pulse train based on an FSE (Fast SE) technique, a pulse train based on a FASE (Fast Asymmetric SE) technique, a pulse train based on an EPI (echo planar imaging), and others.

The calculator 10 receives digital echo data sent from the receiver 8R via the sequencer 5, and maps those data in a Fourier space (also called the k-space or frequency space) formed by an incorporated memory. The calculator 10 also performs a two-dimensional or a three-dimensional Fourier transform on the mapped data, so that an image in the real space is reconstructed.

The storage 11 is able to memorize echo data and reconstructed image data. The display unit 12 is formed to visualize an image. The input device is used to provide the host computer 6 with various types of information about, for example, scan conditions and a pulse sequence.

The voice generator 16, which composes part of the breath-hold instructing unit, is configured to utter, for example, a voice message informing a patient of the start or end of a breath hold in response to a command sent from the host computer 6.

Furthermore, the electrocardiographing unit comprises an ECG sensor 17 attached to the patient body to detect an electric ECG signal and an ECG unit 18 that performs various types of processing including the digitization of the detected ECG signal and sends it to the sequencer 5. The sequencer 5 uses this measured ECG signal as a timing signal when performing a certain scanning sequence. This makes it possible that synchronization timing for electrocardiograph gating is set adequately and an electrocardiograph-gating scan on the set synchronization timing is performed to acquire echo data.

Figure 2:
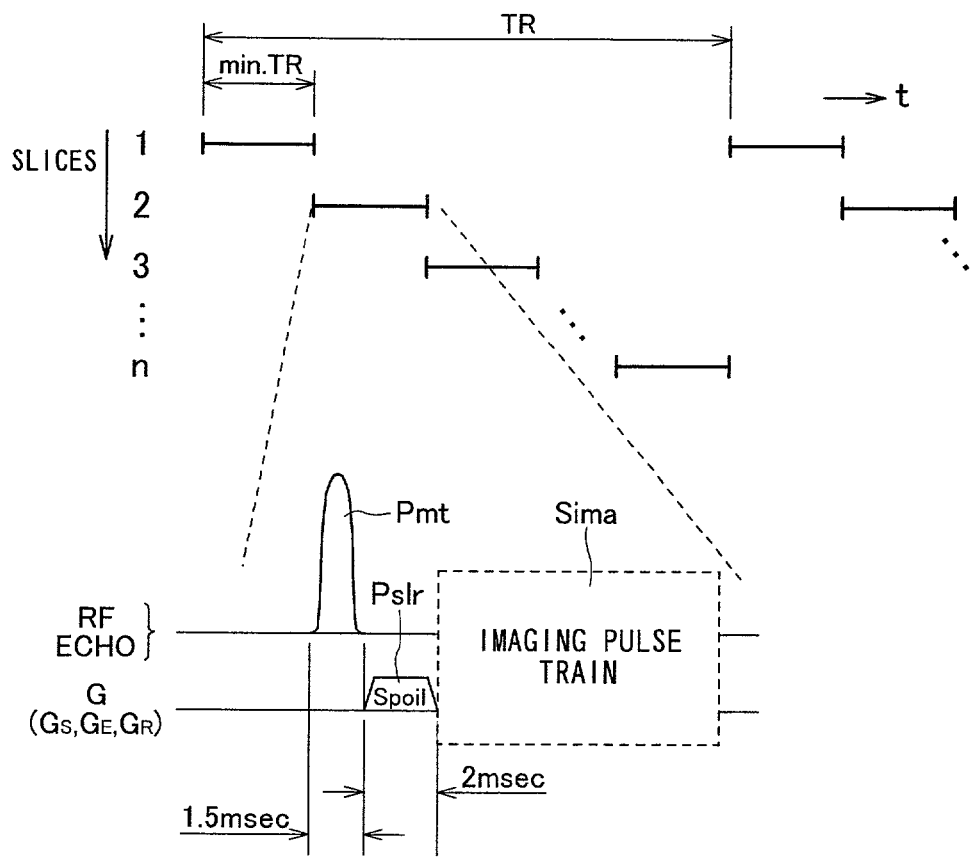
FIG. 2 is a flowchart representing an outline and application timing of a pulse sequence formed based on a two-dimensional scan according to a multislice technique used in a first embodiment of the present invention.

FIG. 2 exemplifies both echo acquisition timing and pulse sequence according to a two-dimensional multislice technique. Each of a plurality of n-piece slices is RF-excited repeatedly at every repetition time TR so as to be subject to echo acquisition. After the excitation of the first slice during each repletion time TR, the remaining slices are sequentially excited in the similar manner for echo acquisition. Thus, any slice undergoes the echo acquisition repeatedly performed at a period of repetition time called "minimum TR."

Figure 3:
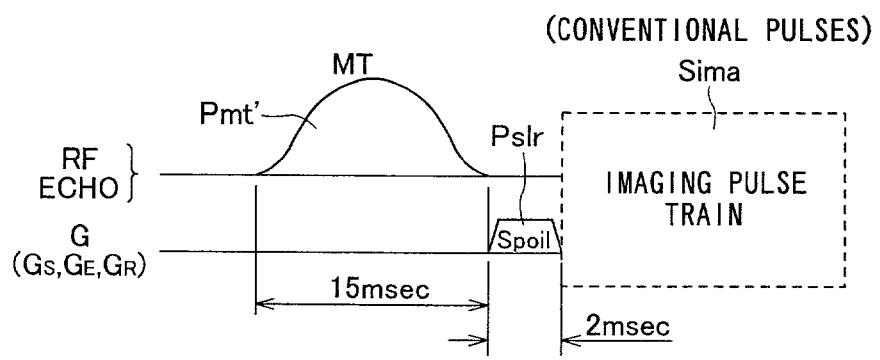
FIG. 3 depicts a pulse sequence indicative of an MT pulse used by a conventional technique, which is described for comparatively explaining the present invention.

The pulse sequence used for this echo acquisition is composed of an MT pulse $P_{mt}$ of which duration is set to a shorter time, one or more spoiler pulses $P_{slr}$, and an imaging pulse train $S_{ima}$, which are aligned in this order along the time axis, as shown in FIG. 2. The spoiler pulses $P_{slr}$, which are in charge of dephasing spin-spin magnetization spins, are formed by spoiler pulses to be applied in any one or more, or all of the slice, phase-encode, and readout directions. Incidentally, FIG. 3 shows a pulse sequence that uses a conventional MT pulse $P_{mt}'$, which is cited for comparative description with that of FIG. 2.

The MT pulse $P_{mt}$ according to the present embodiment is created as an RF pulse formed by modulating a waveform of, such as, a Sinc function or Gaussian function with an RF signal of a specified frequency. For example, the frequency is determined to be a value, which is offset by a specified amount from the resonance center frequency of a water component of an object. The duration of the MT pulse $P_{mt}$ is set to a value of less than 10 msec (for instance, 1.5 msec), which is shorter compared to values as much as 15 msec, which have conventionally been used. Those shorter values have been confirmed by experiments, which will be described later.

In addition, the MT pulse $P_{mt}$ according to the present embodiment has a higher peak value (i.e., intensity) determined in consideration of its shortened duration. Although the peak value of the MT pulse $P_{mt}$ may be increased up to a value that provides its waveform area as much as that of the conventional MT pulse $P_{mt}'$, it is not always necessary to raise the peak value up to such a value. The reason is that contribution thanks to improved MT effects derived from a shortened duration of the MT pulse is greater than that from a non-shortened duration thereof. Additionally, in the case of a two-dimensional scan based on the multislice technique, MT effects obtained when other slices are excited are also contributed. This is another reason why the peak value is not always necessary to raise so much.

In the present embodiment, the MT pulse $P_{mt}$ is configured so that it is applied with no slice gradient, that is, is applied slice-non-selectively. Alternatively, the MT pulse $P_{mt}$ may be subjected to slice-selective application, if necessary.

An experiment conducted by the inventor, which will be detailed later, revealed that, when the duration of the MT pulse $P_{mt}$ was shortened down to a length of less than 10 msec and preceded the imaging pulse train $S_{ima}$ conducted on the two-dimensional multislice technique, a considerable amount of MT effects larger than that of the conventional longer-duration MT pulse was provided. In particular, it was also found that in cases where the duration of the MT pulse $P_{mt}$ was set to a length of 6 msec or less, a remarkably larger amount of MT effects compared to that of the conventional longer-duration MT pulse was given.

Therefore, in the present invention, the MT pulse of which duration is longer means an MT pulse having a duration of 10 msec or over, while the MT pulse of which duration is shorter means an MT pulse having a duration of less than 10 msec.

Like the conventional, the duration of each of the spoiler pulses $P_{sir}$ is set to a length as short as approximately 2 msec. Further, the imaging pulse train $S_{ima}$, which is formed by a train of pulses on a given SE-system or FE-system technique, changes in its duration, depending on its type.

In the present embodiment, the RF coil 7, transmitter 8T, sequencer 5, and host computer 6 cooperatively constitute an essential part of the MT pulse applying means according to the present invention; the gradient coil unit 3, gradient power supply 4, sequencer 5, and host computer 6 cooperatively constitute an essential part of the spoiler applying means according to the present invention; and the RF coil 7, transmitter 8T, receiver 8R, sequencer 5, and host computer 6 cooperatively constitute an essential part of the scanning means according to the present invention.

The operations and advantages of the magnetic resonance imaging system according to the present embodiment will now be described.

In cases where a region to be imaged of an object is for example the head, a desired region of the head is to be scanned by using a two-dimensional multislice technique. The desired region is magnetically divided into a plurality of slices and selectively excited, and then echo signals are acquired from each slice at every repetition time TR.

Figure 4A:
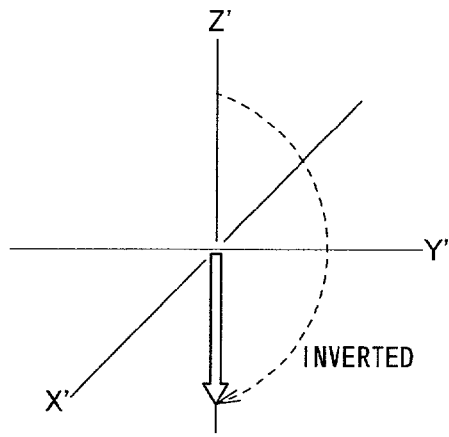
FIGS. 4A and 4B are illustrations of behaviors of spin-lattice magnetization components of spins that move in response to an application of the MT pulse, which comparatively explains the behaviors when long-duration and short-duration MT pulses are applied, respectively.

During such an acquisition process, an MT pulse $P_{mt}$ of which duration is shorter (for example, 1.5 msec) is first applied to the head. As illustrated in FIG. 4A, this application causes a spin-lattice magnetization component of nuclear spins within an excited region is inverted to the $-z'$-axis direction. However, due to the fact the duration of the MT pulse $P_{mt}$ is shorter, a percentage showing the recovery of the spin-lattice magnetization component to its initial state in the z-axis direction during the application of the MT pulse is extremely small or negligible. In other words, "shortening" effects exerted on the spin-lattice component is large, which will promote chemical exchange and/or cross relaxation between protons of both of free water and macromolecules.

After the application of the MT pulse, a spoiler pulse $P_{spl}$ is applied to the object to sufficiently dephase a spin-spin magnetization component of the nuclear spins, which is followed by the application of a specified imaging pulse train $S_{ima}$. During the application of a series of pulses, both of MT effects induced by applying the MT pulse and MT effects induced by applying the imaging pulse train $S_{ima}$ become effective in a multiplied way, because the duration of the MT pulse is shortened.

As described above, when the application of a shorter-duration MT. pulse causes the chemical exchange and/or cross relaxation between protons of the free water and the macromolecules to be accelerated greatly, the signal value of an echo to be acquired becomes lower. Namely, the MT effects gained per unit time increases, providing larger amounts of MT effects.

Figure 4B:
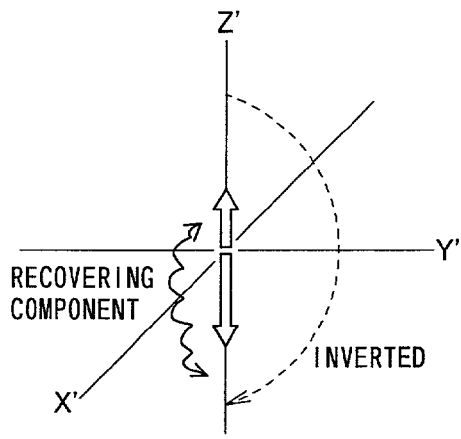

The above description will be detained further in comparison with the conventional way that uses the longer-duration MT pulse. Since the conventional MT pulse is set to a longer period of duration (for instance, 15 msec), a component that recovers to the $+z'$-axis direction begins to appear even during the application of the MT pulse, as illustrated in FIG. 4B. As a result, a net spin-lattice magnetization component that remains in the $-z'$-axis direction at the end of application of the MT pulse becomes small compared to that for the shorter-duration MT pulse (refer to FIG. 4A). This results in that the chemical exchange and/or cross relaxation between the protons of free water and macromolecules are reduced, compared to that performed in the present invention that uses the shorter-duration MT pulse. Hence the value of an acquired echo signal becomes larger than that in the present embodiment. It is therefore concluded that the MT pulse gained becomes smaller correspondingly to the reduced chemical exchange and/or cross relaxation.

Figure 5:
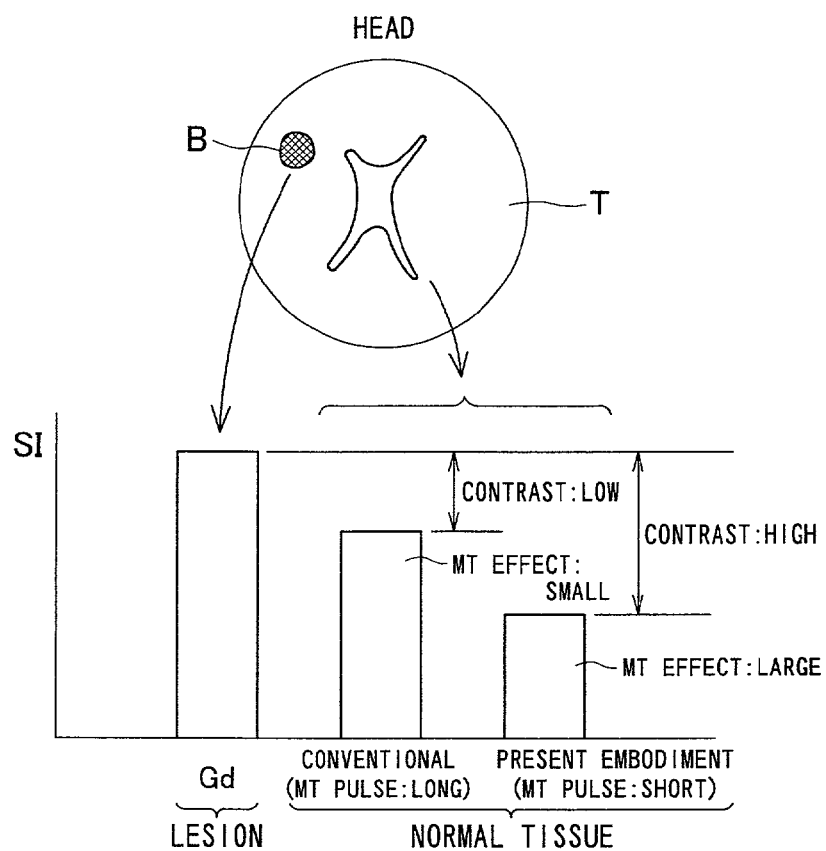
FIG. 5 illustrates the advantages of application of the MT pulse according to the present invention, which accompanies comparison with the application of a conventional MT pulse.

FIG. 5 shows a qualitative comparison between an intensity SI of an echo signal acquired with the shorter-duration MT pulse, like the present embodiment, and an intensity SI of another echo signal acquired with the longer-duration MT pulse, like the conventional. This comparison is conducted based on a sectional image of the head into which an MR contrast agent (for example, gadolinium-DTPA) was injected. Since the contrast agent is less subjected to the MT effects by nature, a lesion D such as a cancer is depicted at a higher signal value when the contrast agent passes the lesion D. The normal tissue T is subjected to a large amount of MT effects so that a signal value is reduced largely, because the shorter-duration MT pulse was used, as described above. Thus, the contrast between the lesion D and the normal tissue T is more enhanced, compared to the conventional.

In contrast, in the case of the conventional imaging using the longer-duration MT pulse, the MT effects gained by the normal tissue T is not so large, on account of the above-mentioned reason. Thus, only a less amount of signal value is reduced by the MT effects. This means that the contrast between the lesion D and the normal tissue T is lower in comparison with that according to the present invention.

Accordingly, as in the present embodiment, using an MT pulse whose duration is shorter and whose waveform area is maintained to a necessary amount greatly improves the contrast between a region undergoing larger amounts of MT effects and another region undergoing only smaller amounts of MT effects. This enables a depiction performance for lesions to be enhanced noticeably. It is therefore preferred to provide T1-weighted images based on a 2D-multislice scan and images on which cartilage is depicted.

In particular, in cases where the two-dimensional multi-slice technique, which uses a relatively shorter repetition time (called "minimum TR" between slices, is adopted, larger amounts of MT effects can be obtained as a whole in a steadier manner. This is because a multiplied effect (which leads to potential MT effects) due to off-resonance excitation to other slices can be obtained together, even when the duration itself of the MT pulse is shorter. Conversely speaking, the multiplied effect on the off-resonance excitation received when other slices are excited makes it possible that sufficient MT effects can be gained even if the waveform area of an MT pulse is set to a slightly smaller value.

In addition, since the duration of an MT pulse can be made smaller, a scan time for each time of excitation can be shorthanded, thus making the whole imaging time shorter.

Moreover, the scan time for each time of excitation is shorter, so that the entire imaging time can also be made shorter even in cases where the number of multislices as many as the conventional is desired to be maintained. By contrast, if an imaging time as longer as the conventional is allowed, the number of multislices can be increased.

One example showing the relationship between the imaging time and the number of multislices will now be described. For imaging the head based on the multislice technique (a slice thickness=7 mm), the number of multi-slices=17 can still be kept, in which the imaging pulse train is formed on the SE technique, a minimum TR=28 msec, and a TR=500 msec. In the case that this SE-basis pulse train includes a conventional MT pulse of which duration is 17 msec (including spoiler pulses), the number of multislices is obliged to reduce to 11 pieces. In contrast, in order to secure the number of multislices to 17 slices, it is required that the repetition time TR be extended up to 765 msec.

However, in cases where the foregoing imaging is done on the technique according to the present invention, in which the duration of an MT pulse to 3.5 msec (including spoiler pulses) with other conditions still maintained to the conventional ones, the number of multislices of 17 slices can be attained by only setting the repetition time TR to 536 msec, which is still limited to a slightly extended length.

To qualitatively confirm the effects of the present invention, the results of experiments conducted by the present inventor will now be described with reference to FIGS. 6 to 9.

Figures 6, 7, 8:
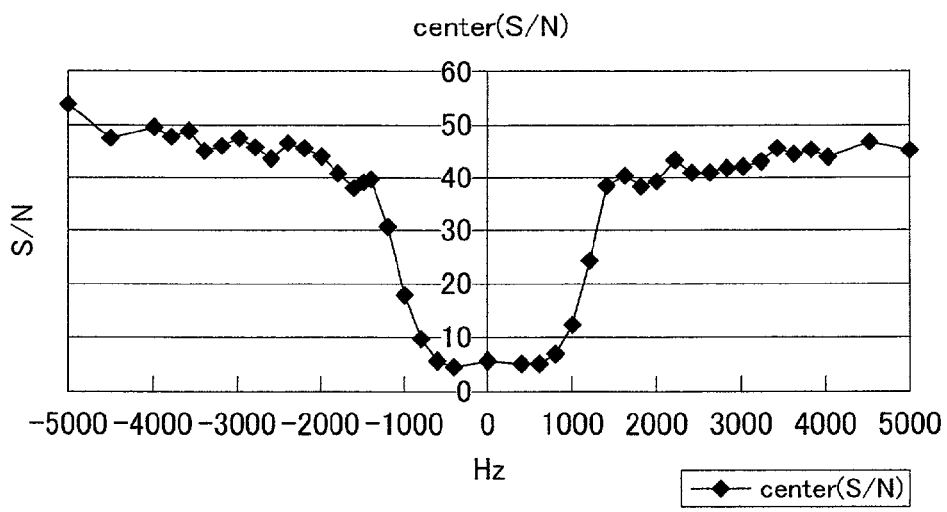
FIG. 6 shows a result from an experiment.
FIG. 7 shows results from another experiment.
FIG. 8 shows results from another experiment.

The results of a first experiment are shown in FIG. 6. This experiment was performed to acquire echo signals based on the multislice technique, while the pulse length of an MT pulse was changed from 10 to 1.5 msec. In this experiment, the number of multislices=17, a flip angle=500°, an MT offset frequency=−1500 Hz, and an MT pulse waveform=sinc (1π, 1π) were determined. In FIG. 6, PVA signal values and noise are provided as numerical values expressed by an arbitrary unit. A pulse length (whole length)=τ–length×2 is specified.

In FIG. 6, a sequence: SE15-MTC5000 (the pulse length of an MT pulse=10 msec) corresponds to the conventional, while a sequence: SE15-MTC750 (the pulse length of an MT pulse=1.5 msec) corresponds to the present invention. Compared to the sequence corresponding to the conventional, the sequence corresponding to the present invention provides both of an MTR (MT ratio) improved by approx. 45% in terms of S/N and a repetition time TR reduced down to the half or less when the number of slices is 17.

Further, when comparing a sequence: SE15-MTC5000 corresponds to the conventional with a sequence: SE15-MTC3000 (the pulse length of an MT pulse=6 msec), it is also found that the MTR is improved (that is, lower S/N value). From this point of view, it is understood that setting the pulse length of an MT pulse to a length less than 10 msec is able to provide the advantages derived from the "shorter-duration MT pulse" that corresponds to the present invention. Thus, it can be understood that the duration of the MT pulse according to the present invention lies in the range of less than 10 msec.

Results of a second experiment are shown in FIG. 7. This experiment was conducted to acquire echo signal under a fixed repetition time TR=500 msec, as the pulse length of an MT pulse was changed from 10 to 1.5 msec. The remaining imaging conditions were the same as those in the first experiment.

This second experiment showed that, for imaging of normal periods of time (i.e., TR=500 msec or thereabouts), assigning the pulse length of an MT pulse to lengths of less than 10 msec is able to provide both of larger MT effects (lower S/N value) and an increased number of slices, compared to the sequence: SE15-MTC5000 corresponding to the conventional. As can be read from the values shown by the S/N and the number of slices, it was also found that these effects are given when the pulse length of the MT pulse falls into the range of less than 10 msec.

A third experiment is shown in FIG. 8. This experiment shows changes in S/N obtained under the conditions that both of the number of slices and a flip angle were fixed, but a frequency offset of an MT pulse was changed. From the present experiment, the ranges were confirmed, in which the MT effects are present on the plus and minus sides of the resonance peak frequency of free water placed at the center of the frequency axis.

Figure 9:
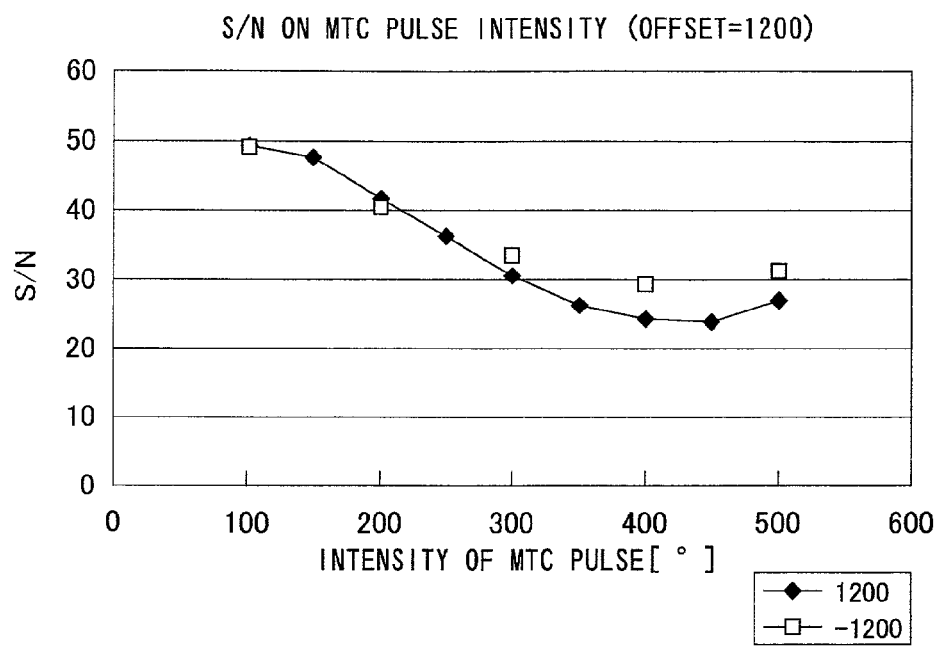
FIG. 9 shows results from another experiment.

Additionally, a fourth experiment is shown in FIG. 9. This experiment represents changes in S/N vs. changes in the flip angle of an MT pulse (that is, the intensity of an MT pulse) obtained when offset frequencies of the MT pulse on the plus and minus sides are set to the same absolute value (that is, 1200 Hz and −1200 Hz). The graphs are expressed by taking the offset frequencies as parameters. Through this experiment, both of the pulse intensity ranges in which the MT effects are created and the symmetry of the pulse intensity ranges were examined.

Although the foregoing experiments were conducted on a PVA phantom, it is also known that, when the human head is compared with the PVA phantom, the human head is generally greater in the MT effects than the PVA phantom. As a result, for applying the imaging according to the present invention to the human head, the MT effects derived from the "shorter-duration MT pulse" becomes more remarkable. This also proves the effectiveness of the present invention.

(Second Embodiment)

Figure 10:
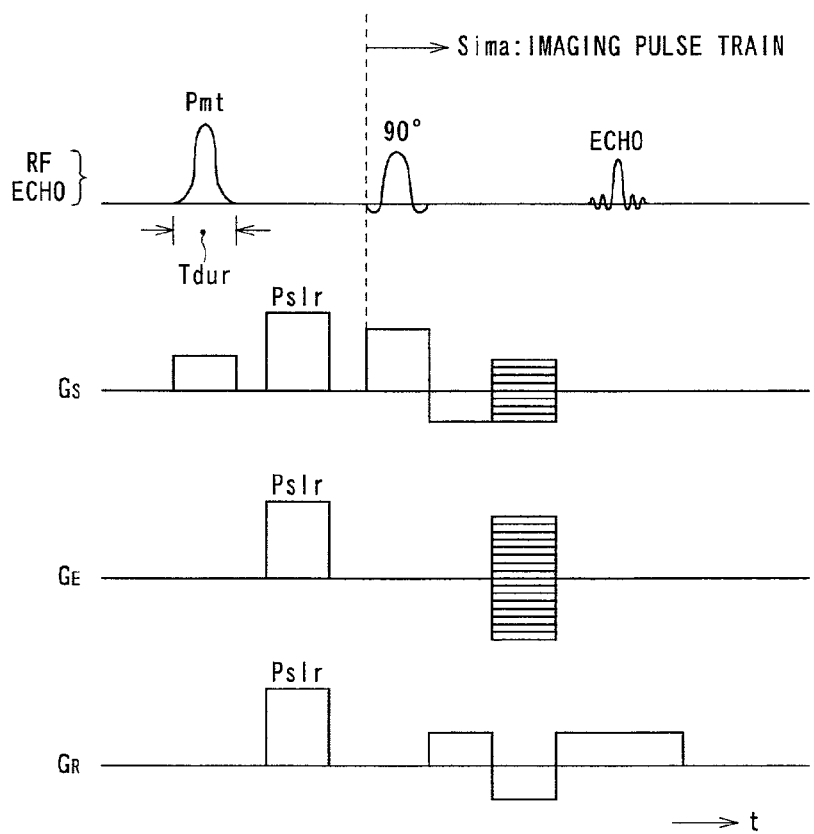
FIG. 10 is a flowchart outlining a pulse sequence formed based on a three-dimensional scan used in a second embodiment of the present invention.
Figure 11:
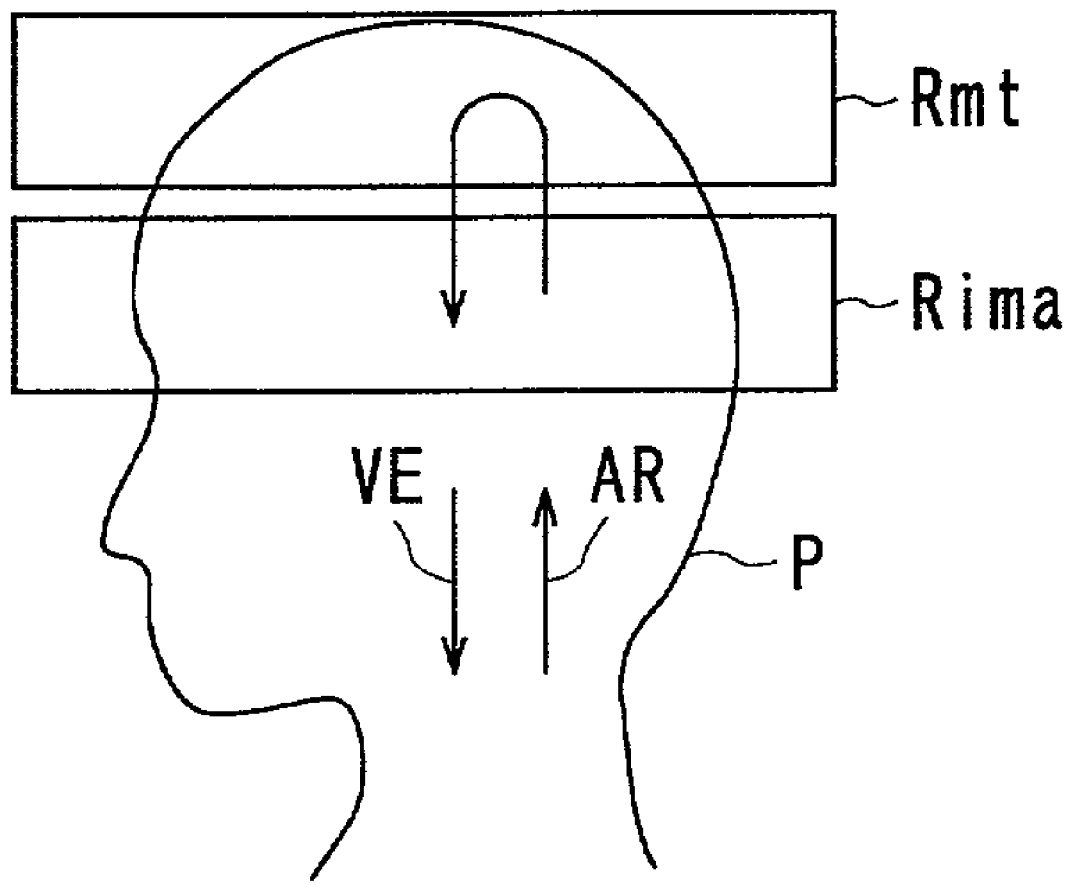
FIG. 11 illustrates exemplifying a positional relationship between a pre-excited region to which an MT pulse is applied and an imaging region to which an imaging pulse train is applied in the second embodiment.

Referring to FIGS. 10 and 11, a second embodiment according to the magnetic resonance imaging system of the present invention will now be described.

Instead of the two-dimensional scan with the use of the two-dimensional multislice technique, the second embodiment provides a magnetic resonance imaging system capable of imaging based on a three-dimensional scan technique as described for example in U.S. Pat. No. 5,627,468, to which the foregoing MT pulse is applied as well. This magnetic resonance imaging system is similar in the hardware configuration to that of the first embodiment, so its detailed explanation will be omitted.

In the magnetic resonance imaging system, under the control of the sequencer 5, a pulse sequence shown in FIG. 10 is conducted by way of example for the three-dimensional scan.

As understood from the figure, the pulse sequence includes an MT pulse $P_{mt}$ applied first together with a slice magnetic gradient $G_S$, which is followed by spoiler pulses $P_{slr}$ applied in the slice, phase-encode, and readout (frequency encode) directions for the gradients $G_S$, $G_E$ and $G_R$, respectively. Then, a three-dimensional imaging pulse train $S_{ima}$ formed by for example a train of pulses on the FE technique is applied to the object.

Of these pulses, the duration-shortening technique according to the present invention is applied to the MT pulse $P_{mt}$. In other words, like the first embodiment, the duration $T_{dur}$ is shortened down to a length of less than 10 msec. The flip angle of the MT pulse $P_{mt}$ is set to 6 to 32 μT, when expressed in terms of the intensity of an RF magnetic field, and preferably, to 19 to 26 μT. If converted into angles, RF magnetic field intensities of 6 μT and 32 μT correspond to 90 degrees and 500 degrees, respectively.

The slice magnetic gradient $G_S$ applied in parallel with the MT pulse $P_{mt}$ is determined in advance, for example, in its intensity so that a pre-excited region $R_{mt}$ different in position from a desired imaging region $R_{ima}$ can be selected, as shown in FIG. 11. For example, as shown in FIG. 11, the desired imaging region $R_{ima}$ is the human head, the pre-excited region $R_{mt}$ can therefore be placed at a certain position of the head-top portion, which is farther than the imaging region $R_{ima}$ to the hart. Accordingly, a region to which the MT pulse $P_{mt}$ is applied is limited to the pre-excited region $R_{mt}$ set on the head-top side, resulting in that no excitation is caused in blood flow that inflows into the imaging region $R_{ima}$ from the heart on its inflowing side.

On completion of the MT pulse $P_{mt}$ of which duration is shorter, the spoiler pulses $P_{slr}$ are then applied, by way of example, in each of the slice, phase-encode, and readout directions.

The application of pulses belonging to the imaging pulse train $S_{ima}$ to the imaging region $R_{ima}$ is then followed in turn, so that echo signals are acquired from the imaging region $R_{ima}$. The echo signals include an echo signal having an intensified amplitude, which emanates from blood flow. Namely, the artery AR that has inflowed into the head from the heart is subjected, for the first time, to excitation due to the imaging pulse train $S_{ima}$ as soon as it enters the imaging region $R_{ima}$. Thus this excitation allows the artery AR to create an echo signal of higher intensity. However, the vein VE that has returned to the heart by way of its head top portion was already subject to the excitation at the pre-excited region $R_{mt}$ located on the head-top side of the image region $R_{ima}$. Thus, the vein VE generates only an echo signal of lower intensity at the imaging region $R_{ima}$.

Therefore, the signal level from the vein VE can be suppressed, whilst the signal level from the artery AR, which is more significant in clinical applications, can be enhanced relatively. Further, in addition to the application of the MT pulse $P_{mt}$ to the pre-excited region $R_{mt}$, the pre-excited region $R_{mt}$ is located in the vicinity of the imaging region $R_{ima}$, but separated therefrom. A percentage of lowering the intensity of echo signals emanating from parenchyma in the imaging region $R_{ima}$ is larger than that from blood flow (that is, larger amounts of MT effects are produced). An enhancement in the MT effects becomes more noticeable thanks to use of the shorter-duration MT pulse $P_{mt}$ formed in compliance with the present embodiment. The noticeable MT effects can be used to perform MR angiography for imaging peripheral blood vessels with precision.

In addition, according to necessity, the pre-excited region $R_{mt}$ can be located nearer to the heart than the imaging region $R_{ima}$. This location makes it possible to perform MR angiography that provides image data in which the vein VE is more emphasized than the artery AR.

As described above, since the second embodiment adopts the shorter-duration MT pulse, the MT effects equivalent in magnitude to those from the conventional can be gained and a scan time (resulting in an imaging time) necessary for the application of the MT pulse can largely be lessened compared to the conventional.

In addition, for performing MR imaging with a two-dimensional scan based on a multislice technique, a shorter-duration MT pulse is incorporated in a pulse sequence for the scan. Through this technique, the number of multislices can be kept to an amount equivalent to the conventional and a scan time can be shortened to a minimum. MT effects of which magnitudes are equivalent to or larger than those in the conventional can be obtained, so that the contrast of images is enhanced to improve depiction performances of the MR images. Like this two-dimensional scan, for performing MR imaging with a three-dimensional scan involving an MT pulse, the MT pulse can be replaced by the shorter-duration MT pulse according to the present invention. Hence, both of preferable MT effects and a shortened scan time can be realized at the same time.

Although the embodiments described above contain many specificities, these should not be construed as limiting the scope of the present invention but as mealy providing illustrations of some of the presently preferred embodiments of the present invention. The person skilled in the art can alter or modify the present invention into a variety of different modes without departing from the scope of the appended claims and their equivalents. By way of example, the MR imaging that uses the MT pulse according to the present invention can be applied to imaging of other type of fluid, such as cerebral spinal fluid that moves within an object.

What is claimed is:

1. A magnetic resonance imaging system comprising:
   MT-pulse applying means for applying to an object an MT (magnetization transfer) pulse formed as RF (radio frequency) pulse of (i) a frequency which is off-resonance at a region to be imaged, (ii) duration less than 10 ms, and (iii) a waveform based on either a Sinc function or a Gaussian function;
   gradient applying means for applying, concurrently with application of the MT pulse, a gradient pulse to select an applied position of the MT pulse to the object so that the applied position of the MT pulse is different from the region to be imaged;

spoiler applying means for applying a gradient spoiler pulse to the object after applying both the MT pulse and the gradient pulse to the region to be imaged; and scanning means for performing a scan to acquire an echo signal from the region to be imaged after applying the gradient spoiler pulse.

2. The magnetic resonance imaging system according to claim 1 wherein the duration of the MT pulse is set to a period of time during which relaxation of a spin-lattice magnetization of magnetic spins in the object is substantially not completed.

3. The magnetic resonance imaging system according to claim 2, wherein the scan is a two-dimensional scan performed based on a multi-slice imaging technique.

4. The magnetic resonance imaging system according to claim 2, wherein the scan is a three-dimensional scan performed based on a multi-slice imaging technique.

5. A magnetic resonance imaging method for acquiring an echo signal on the basis of magnetic resonance phenomena of at least two types of nuclear pools in an object, the two types of nuclear pools being mutually coupled through a coupling relationship based on at least one of a chemical exchange phenomenon and a cross relaxation phenomenon, the method comprising:

decoupling the coupling relationship between the at least two types of nuclear pools by applying to the object an MT (magnetization transfer) pulse formed as an RF (radio frequency) pulse of (i) a frequency which is off-resonance at a region to be imaged, (ii) duration less than 10 ms, and (iii) a waveform based on either a Sinc function or a Gaussian function;

applying a gradient spoiler pulse to the decoupled nuclear pools applying, concurrently with application of MT pulse, a gradient pulse so as to select an applied position of the MT pulse which is different from the region to be imaged; and acquiring the echo signal from the region to be imaged after applying the gradient spoiler.

6. The magnetic resonance imaging method according to claim 5, wherein the two types of nuclear pools consist of a nuclear pool of free water and a nuclear pool of a macromolecule.

7. The magnetic resonance imaging method according to claim 6, wherein the echo signal from the region to be imaged is acquired by a two-dimensional scan performed based on a multi-slice imaging technique.

8. The magnetic resonance imaging method according to claim 6, wherein the echo signal from the region to be imaged is acquired by a three-dimensional scan performed based on a multi-slice imaging technique.

9. A magnetic resonance imaging system comprising:

an MT-pulse applying unit configured to apply to an object an MT (magnetization transfer) pulse formed as an RE (radio frequency) pulse of (i) a frequency which is off-resonance at a region to be imaged, (ii) a duration less than 10 ms, and (iii) a waveform based on either a Sinc function or a Gaussian function;

a region selecting unit configured to apply, concurrently with application of the MT pulse, a gradient pulse to select an applied position of the MT pulse that is different from the region to be imaged;

a spoiler applying unit configured to apply a gradient spoiler pulse to the object after applying the MT pulse to the region to be imaged; and a scanning unit configured to perform a scan to acquire an echo signal from the region to be imaged after applying the gradient spoiler pulse to the object.

10. The magnetic resonance imaging system according to claim 9, wherein the duration of the MT pulse is 6 ms or less.

11. The magnetic resonance imaging system according to claim 9, wherein the scan is a two-dimensional scan performed based on a multi-slice imaging technique.

12. The magnetic resonance imaging system according to claim 9, wherein the scan is a three-dimensional scan performed based on a multi-slice imaging technique.

13. The magnetic resonance imaging system according to claim 9, wherein the duration of the MT pulse is set to a period of time during which relaxation of a spin-lattice magnetization of magnetic spins in the object is substantially not completed.

* * * * *